(12) United States Patent
Takahashi

(10) Patent No.: US 12,108,527 B2
(45) Date of Patent: Oct. 1, 2024

(54) FILTER DEVICE

(71) Applicant: Murata Manufacturing Co., Ltd., Kyoto (JP)

(72) Inventor: Wataru Takahashi, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 246 days.

(21) Appl. No.: 17/822,283

(22) Filed: Aug. 25, 2022

(65) Prior Publication Data

US 2023/0063635 A1 Mar. 2, 2023

(30) Foreign Application Priority Data

Aug. 26, 2021 (JP) .................................. 2021-137775

(51) Int. Cl.
*H05K 1/02* (2006.01)
*H03H 1/00* (2006.01)
(Continued)

(52) U.S. Cl.
CPC .......... *H05K 1/0298* (2013.01); *H05K 1/115* (2013.01); *H05K 2201/10015* (2013.01); *H05K 2201/1003* (2013.01); *H05K 2201/1006* (2013.01)

(58) Field of Classification Search
CPC ...... H05K 1/02; H05K 1/0233; H05K 1/0298; H05K 1/115; H05K 1/162; H05K 3/46; H05K 2201/1003; H05K 2201/1006; H05K 2201/10015; H03H 1/00; H03H 3/00; H03H 7/0115; H03H 7/0138; H03H 7/09; H03H 7/175; H03H 7/461; H03H 7/465; H03H 7/466; H03H 7/1725; H03H 7/1758; H03H 7/1766; H03H 7/1775; H03H 7/1791; H03H 9/0547; H03H 9/0552; H03H 9/0561; H03H 9/131; H03H 9/542; H03H 9/545; H03H 9/566; H03H 9/1071
USPC .............. 361/782, 56, 91.1, 111, 119, 321.1; 333/133, 134, 175, 176, 185, 189, 195, 333/202, 204, 208, 210, 264
See application file for complete search history.

(56) References Cited

U.S. PATENT DOCUMENTS

2020/0204137 A1\* 6/2020 Choi .................... H03H 7/0115
2020/0204138 A1\* 6/2020 Choi ...................... H03H 7/175
(Continued)

FOREIGN PATENT DOCUMENTS

JP 2020-115616 A 7/2020

*Primary Examiner* — Xiaoliang Chen
(74) *Attorney, Agent, or Firm* — Pearne & Gordon LLP

(57) ABSTRACT

A filter device includes: a multilayer board including a first dielectric layer, a first wiring layer including a reference electrode to which a reference potential is supplied, and a second dielectric layer positioned between the first dielectric layer and the first wiring layer and having a thickness different from a thickness of the first dielectric layer; a series passive element provided on a series wire electrically connecting a first terminal and a second terminal together; a first parallel wire electrically connecting the series wire and the reference electrode together; and a first parallel passive element provided on the first parallel wire. The first parallel wire includes: a first via penetrating through the first dielectric layer and electrically connected to the first parallel passive element; and a second via penetrating through the second dielectric layer and electrically connecting the first via and the reference electrode together.

13 Claims, 11 Drawing Sheets

(51) Int. Cl.
  *H03H 3/00*   (2006.01)
  *H03H 7/09*   (2006.01)
  *H05K 1/11*   (2006.01)
  *H05K 3/46*   (2006.01)

(56) References Cited

U.S. PATENT DOCUMENTS

| | | | |
|---|---|---|---|
| 2020/0204141 A1* | 6/2020 | Choi | H03H 7/0115 |
| 2020/0204142 A1* | 6/2020 | Choi | H03H 7/1725 |
| 2020/0205285 A1* | 6/2020 | Choi | H05K 1/165 |
| 2020/0219861 A1* | 7/2020 | Kamgaing | H03H 9/0561 |
| 2020/0235714 A1 | 7/2020 | Jeong et al. | |
| 2020/0235716 A1* | 7/2020 | Eid | H01L 23/66 |
| 2020/0287520 A1* | 9/2020 | Kamgaing | H03H 9/1014 |
| 2020/0373949 A1* | 11/2020 | Hisano | H03H 7/0115 |
| 2020/0382152 A1* | 12/2020 | Tsukamoto | H03H 7/461 |
| 2020/0395353 A1* | 12/2020 | Shimoichi | H01L 23/5227 |
| 2021/0391853 A1* | 12/2021 | Jann | H03M 1/502 |

\* cited by examiner

FILTER DEVICE

CROSS REFERENCE TO RELATED APPLICATION

This application claims priority from Japanese Patent Application No. 2021-137775 filed on Aug. 26, 2021. The content of this application is incorporated herein by reference in its entirety.

BACKGROUND ART

The present disclosure relates to filter devices.

A filter having a plurality of components mounted on a circuit board has been disclosed (for example, Japanese Unexamined Patent Application Publication No. 2020-115616).

BRIEF SUMMARY

In the filter described in Japanese Unexamined Patent Application Publication No. 2020-115616, components having an inductor, a resonance circuit, and an acoustic wave resonator respectively on board are mounted on an upper surface of the circuit board. On a lower surface of the circuit board, terminals are provided. The terminals are each electrically connected to a relevant one of the components through a via penetrating through the circuit board.

Meanwhile, when the components are closely arranged to reduce the size of the filter, an electromagnetic coupling among the components may cause an increase in signal power loss or deterioration in attenuation characteristics.

The present disclosure provides a filter device in which, with a reduction in size, deterioration in filter characteristics can be suppressed.

A filter device according to an aspect of the present disclosure includes a multilayer board, a series passive element, a first parallel wire, and a first parallel passive element. The multilayer board includes a first dielectric layer, a first wiring layer including a reference electrode to which a reference potential is supplied, and a second dielectric layer positioned between the first dielectric layer and the first wiring layer and having a thickness different from a thickness of the first dielectric layer. The series passive element is provided on a series wire electrically connecting a first terminal and a second terminal together. The first parallel wire electrically connects the series wire and the reference electrode together. The first parallel passive element is provided on the first parallel wire. The first parallel wire includes a first via penetrating through the first dielectric layer and electrically connected to the first parallel passive element, and a second via penetrating through the second dielectric layer and electrically connecting the first via and the reference electrode together. The first dielectric layer is positioned between the first parallel passive element and the second dielectric layer. A cross-sectional area of the first via and a cross-sectional area of the second via are different.

According to the present disclosure, it is possible to provide a filter device in which, with a reduction in size, deterioration in filter characteristics can be suppressed.

DETAILED DESCRIPTION

Figure 1:
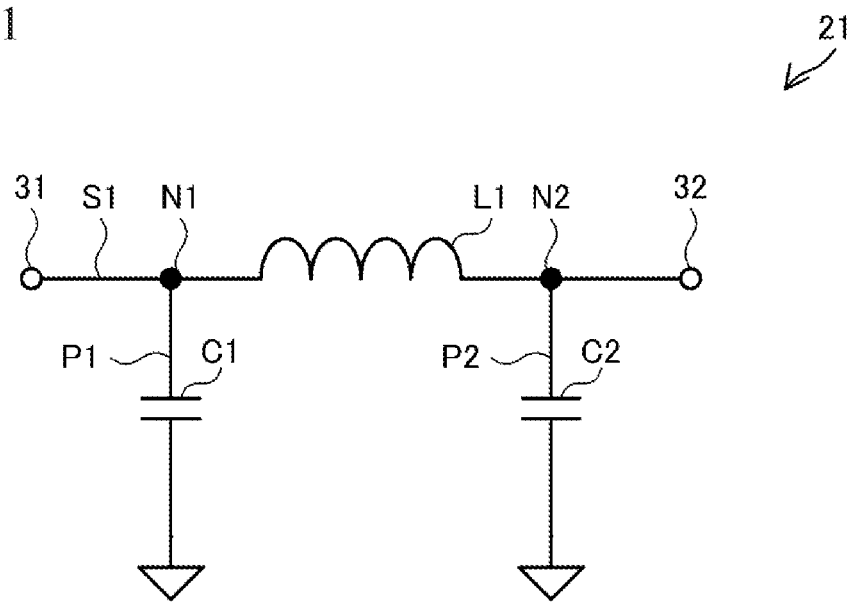
FIG. 1 is a circuit diagram of a filter circuit 21.

Embodiments of the present disclosure are described in detail below with reference to the drawings. Note that the same components are provided with the same reference character and redundant description is omitted as much as possible.

Embodiment 1

A filter device 11 and a filter circuit 21 according to Embodiment 1 are described. FIG. 1 is a circuit diagram of the filter circuit 21. As depicted in FIG. 1, the filter circuit 21 includes an inductor L1 and capacitors C1 and C2.

The filter circuit 21 is a π-type low pass filter. In the filter circuit 21, a series wire S1 electrically connects an input terminal 31 (first terminal) to which a radio frequency (RF) signal from, for example, a power amplifier is supplied, and an output terminal 32 (second terminal) together. A parallel wire P1 electrically connects a node N1 provided on the series wire S1 and the ground. A parallel wire P2 electrically connects a node N2 provided on the series wire S1 and the ground. Note that the parallel wire P1 corresponds to a "first parallel wire" and the parallel wire P2 corresponds to a "second parallel wire" or "branch wire".

The inductor L1 is provided on the series wire S1, and has a first end connected to the input terminal 31 through the node N1 and a second end connected to the output terminal 32 through the node N2.

The capacitor C1 is provided on the parallel wire P1, and has a first end connected to the first end of the inductor L1 through the node N1 and a second end connected to the ground. The capacitor C2 is provided on the parallel wire P2, and has a first end connected to the second end of the inductor L1 through the node N2 and a second end connected to the ground.

Note that while the structure has been described in which the filter circuit 21 is a π-type filter, this is not meant to be restrictive. The filter circuit 21 may be a filter of another connection mode, such as L type or T type.

Also, while the structure has been described in which the filter circuit 21 is a low pass filter, this is not meant to be restrictive. For example, the filter circuit 21 may be changed to a high pass filter by, for example, replacing the inductor L1 by a capacitor and replacing the capacitors C1 and C2 by inductors. Also, the filter circuit 21 can be changed to a band pass filter, a band elimination filter, or the like.

Furthermore, while the structure of the filter circuit 21 has been described in which a signal is supplied to the input terminal 31, this is not meant to be restrictive. The structure may be such that a signal is supplied to the output terminal 32.

In each drawing, an x axis, a y axis, and a z axis may be depicted. The x axis, the y axis, and the z axis form three-dimensional orthogonal coordinates in a right-handed system. In the following, the arrow direction of the x axis may be referred to as an x-axis+side and the direction opposite to the arrow direction may be referred to as an x-axis−side, and the same goes for the other axes. Note that the z-axis+side and the z-axis−side may be referred to as an "upper side" and a "lower side", respectively. Also, the z-axis direction may be referred to as a "thickness direction". Furthermore, planes orthogonal to the x axis, the y axis, and the z axis may be referred to as a yz plane, a zx plane, and an xy plane, respectively. Here, a direction of clockwise rotation when viewed from the upper side to the lower side is defined as a clockwise direction cw. Also, a direction of counterclockwise rotation when viewed from the upper side to the lower side is defined as a counterclockwise direction ccw.

Figure 2:
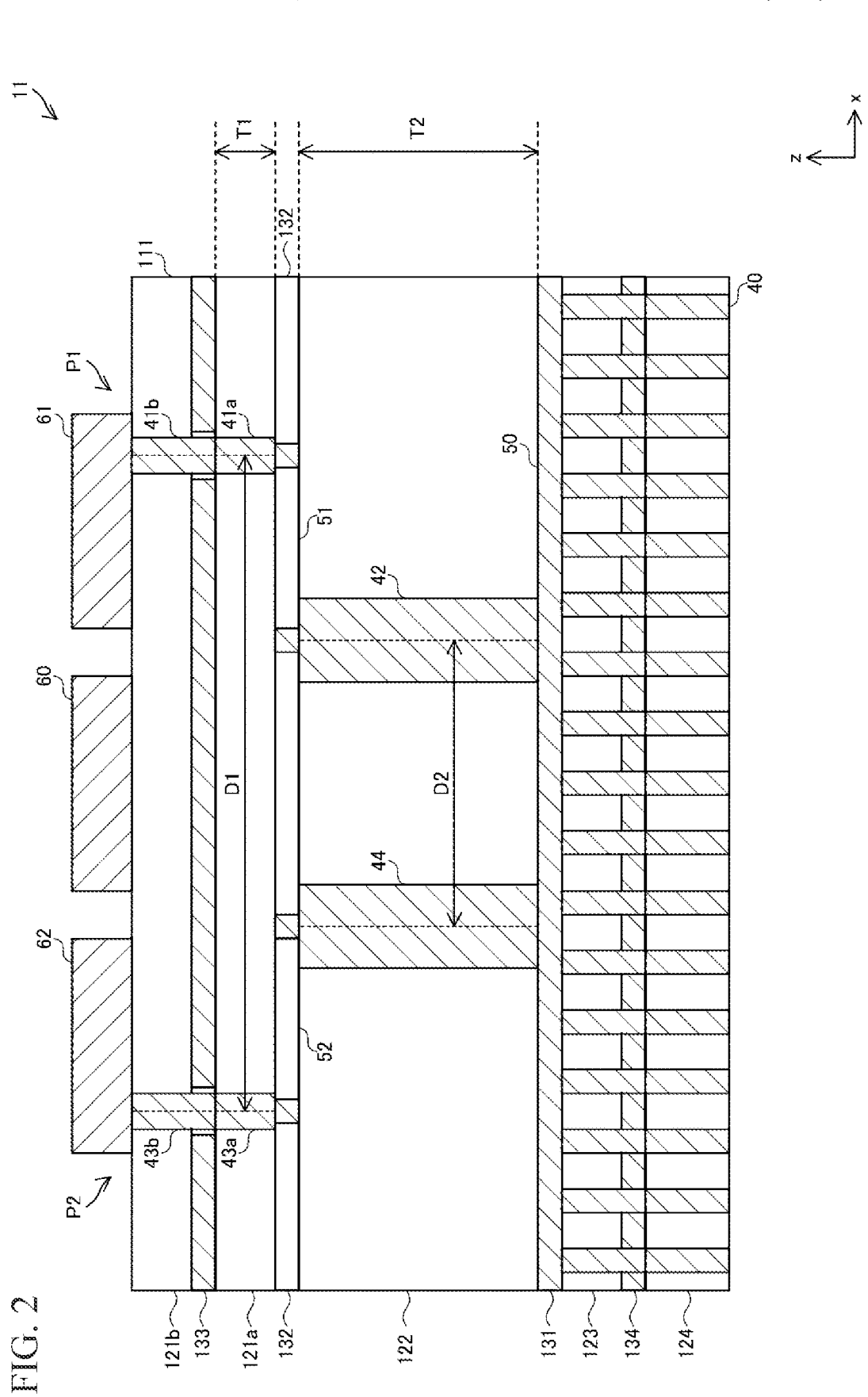
FIG. 2 is a drawing schematically depicting a cross section of a filter device 11 where the filter circuit 21 is formed, the cross section being parallel to a zx plane.
Figure 3:
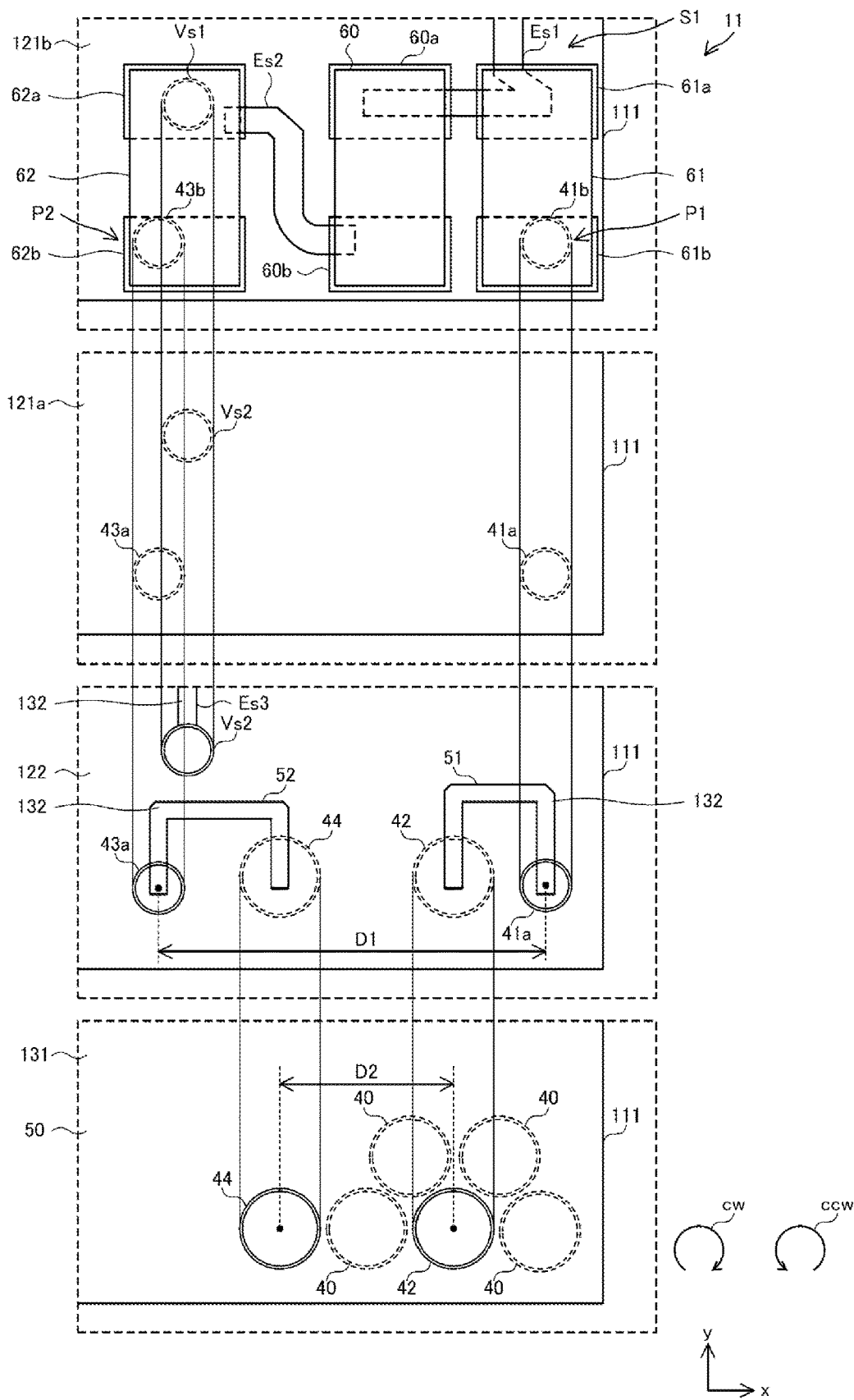
FIG. 3 is a drawing schematically depicting each cross section of the filter device 11 where the filter circuit 21 is formed, the cross section being parallel to an xy plane.

FIG. 2 is a drawing schematically depicting a cross section of the filter device 11 where the filter circuit 21 is formed, the cross section being parallel to a zx plane. FIG. 3 is a drawing schematically depicting each cross section of the filter device 11 where the filter circuit 21 is formed, the cross section being parallel to an xy plane.

As depicted in FIG. 2 and FIG. 3, the filter device 11 includes a series passive element 60, parallel passive elements 61 (first parallel passive element) and 62 (second parallel passive element), a multilayer board 111, the series wire S1, and the parallel wires P1 and P2. The parallel wire P2 is a wire independent from the parallel wire P1. The parallel wire P1 includes vias 41a (first via), 41b, and 42 (second via) and an electrode 51. The parallel wire P2 includes vias 43a (third via), 43b, and 44 (fourth via) and an electrode 52. In the present embodiment, each via is formed of a conductive material and has a columnar shape extending in the thickness direction. Note that each via may have any shape.

The multilayer board 111 includes dielectric layers 121a (first dielectric layer), 121b, 122 (second dielectric layer), 123, and 124 and wiring layers 131 (first wiring layer), 132 (second wiring layer), 133, and 134.

The dielectric layers 121b, 121a, 122, 123, and 124 are provided in this sequence from the upper side toward the lower side. The dielectric layer 122 is, for example, a core layer. The dielectric layers 121b, 121a, 123, and 124 are each formed of, for example, prepreg.

The dielectric layers 121b, 121a, 122, 123, and 124 each has a surface substantially parallel to an xy plane and oriented upward (which may be hereinafter referred to as an upper surface) and a surface substantially parallel to the xy plane and oriented downward (which may be hereinafter referred to as a lower surface). The upper surface of the dielectric layer 122 is opposed to the lower surface of the dielectric layer 121a positioned on the upper side of the dielectric layer 122. The same goes for the other dielectric layers. Note that the upper surface and the lower surface may have, for example, asperities generated at the time of manufacture or a recess for providing a wiring layer.

The wiring layer 131 is provided between the dielectric layer 122 and the dielectric layer 123. The wiring layer 131 includes a reference electrode 50 to which a reference potential is supplied. The reference electrode 50 is, for example, an electrode formed over the entire region of the lower surface of the dielectric layer 122 and connected to the ground. Note that the reference electrode 50 is not necessarily required to be formed over the entire region of the lower surface of the dielectric layer 122 and is only required to be formed at least a partial region of the lower surface of the dielectric layer 122.

For example, the wiring layer 134 is provided between the dielectric layer 123 and the dielectric layer 124. For example, the wiring layer 133 is provided between the dielectric layer 121a and the dielectric layer 121b. The dielectric layers 123 and 124 are provided with a plurality of vias 40 penetrating through the dielectric layers 123 and 124. Upper end portions of the vias 40 are electrically connected to the reference electrode 50.

The dielectric layer 122 is positioned between the dielectric layer 121a and the wiring layer 131, and has a thickness T2 different from a thickness T1 of the dielectric layer 121a. The "thickness" herein is a size of the dielectric layer in a direction in which the dielectric layers 121b to 124 are laminated in the multilayer board 111, that is, a distance between the upper surface and the lower surface of the dielectric layer. In the present embodiment, the thickness T1 is smaller than the thickness T2. Note that the thickness T1 may be larger than the thickness T2.

The dielectric layer 121a is positioned between the dielectric layer 122 and the parallel passive elements 61 and 62 and the series passive element 60. In the present embodiment, the parallel passive elements 61 and 62 and the series passive element 60 are provided on the upper surface of the dielectric layer 121b.

With reference to FIG. 2 and FIG. 3, a layout of each passive element, each via, and each electrode is described below. FIG. 3 depicts a drawing of the dielectric layer 121b and each passive element viewed from above, a drawing of the dielectric layer 121a viewed from above, and a drawing of the dielectric layer 122 and the wiring layer 132 viewed from above, and a drawing of the wiring layer 131 viewed from above.

In the present embodiment, when the upper surface of the dielectric layer 121b is viewed in plan view along the z-axis direction, the filter device 11 is provided at a corner on the x-axis+side and the y-axis−side of the multilayer board 111. The parallel passive element 61, the series passive element 60, and the parallel passive element 62 are surface mount devices (SMDs) functioning as the capacitor C1, the inductor L1, and the capacitor C2, respectively. The parallel passive element 61, the series passive element 60, and the parallel passive element 62 are provided in this order from the x-axis+side toward the x-axis−side.

The series wire S1 includes, for example, electrodes Es1, Es2, and Es3 and vias Vs1 and Vs2. The electrodes Es1 and Es2 are formed on the upper surface of the dielectric layer 121b. The electrode Es3 is formed on the wiring layer 132. The vias Vs1 and Vs2 penetrate through the dielectric layers 121b and 121a, respectively, substantially in parallel with the z axis.

The electrode Es1 has a first end connected to the input terminal 31 (not depicted) and a second end. The series passive element 60 has a first end connected to the second end of the electrode Es1 through a pad 60a and a second end. The electrode Es2 has a first end connected to the second end of the series passive element 60 through a pad 60b and a second end.

An upper end portion of the via Vs1 is connected to the second end of the electrode Es2 through a pad 62a. An upper end portion of the via Vs2 is connected to a lower end portion of the via Vs1. The electrode Es3 has a first end connected to a lower end portion of the via Vs2 and a second end connected to the output terminal 32 (not depicted).

In the present embodiment, the parallel wire P1 includes the vias 41b, 41a, and 42 and the electrode 51. The parallel wire P2 includes the vias 43b, 43a, and 44 and the electrode 52.

The vias 41b and 43b penetrate through the dielectric layer 121b substantially in parallel with the z axis. When the upper surface of the dielectric layer 121b is viewed in plan view along the z-axis direction, the vias 41b and 43b overlap the parallel passive elements 61 and 62, respectively. The diameter of the via 41b is, for example, substantially equal to the diameter of the via 43b.

The parallel passive element 61 electrically connects the series wire S1 and the via 41b together. More specifically, the parallel passive element 61 has a first end connected to the electrode Es1 through a pad 61a and a second end connected to an upper end portion of the via 41b through a pad 61b.

The parallel passive element 62 electrically connects the series wire S1 and the via 43b together. More specifically, the parallel passive element 62 has a first end connected to the second end of the electrode Es2 through the pad 62a and a second end connected to an upper end portion of the via 43b through a pad 62b.

The vias 41a and 43a penetrate through the dielectric layer 121a substantially in parallel with the z axis. In the present embodiment, the vias 41a and 43a have diameters substantially equal to the diameter of the via 41b and the diameter of the via 43b, respectively. When the upper surface of the dielectric layer 121a is viewed in plan view along the z-axis direction, the vias 41a and 43a substantially completely overlap the vias 41b and 43b, respectively. An upper end portion of the via 41a and an upper end portion of the via 43a are connected to a lower end portion of the via 41b and a lower end portion of the via 43b, respectively.

The wiring layer 132 is positioned opposite to the wiring layer 131 with reference to the dielectric layer 122. In the present embodiment, the wiring layer 132 is positioned between the dielectric layer 121a and the dielectric layer 122.

The wiring layer 132 includes the electrode 51 (first electrode) and the electrode 52 (second electrode). The electrode 51 is extended from the via 41a, and electrically connects the via 41a and the via 42 together. The electrode 52 is extended from the via 43a, and electrically connects the via 43a and the via 44 together. Note herein that "extended" indicates "extended so as to have a predetermined length".

Note that the wiring layer 132 may be positioned between the dielectric layer 121a and the dielectric layer 121b. In this case, when the upper surface of the dielectric layer 121a is viewed in plan view along the z-axis direction, the vias 41a and 43a are provided so as not to overlap the vias 41b and 43b, respectively. The electrode 51 electrically connects an upper end portion of the via 41a and a lower end portion of the via 41b together. The electrode 52 electrically connects the upper end portion of the via 43a and the lower end portion of the via 43b together.

Also, the wiring layer 132 may be provided on the upper surface of the dielectric layer 121b. In this case, when the upper surface of the dielectric layer 121b is viewed in plan view along the z-axis direction, the vias 41b and 43b are provided so as not to overlap the parallel passive elements 61 and 62, respectively. The electrode 51 electrically connects an upper end portion of the via 41b and the second end of the parallel passive element 61 together. The electrode 52 electrically connects the upper end portion of the via 43b and the second end of the parallel passive element 62 together.

The electrodes 51 and 52 are each wound on a plane where the wiring layer 132 extends. Also, the orientation in which the electrode 51 is wound and the orientation in which the electrode 52 is wound are opposite. More specifically, the electrode 51 has a first end connected to a lower end portion of the via 41a and a second end positioned on an x-axis–side of the first end. The electrode 51 is wound from the first end to the second end to the counterclockwise direction ccw on the xy plane with a turn more than or equal to ¼ and less than ¾.

The electrode 52 has a first end connected to a lower end portion of the via 43a and a second end positioned on an x-axis+side of the first end. The electrode 52 is wound from the first end to the second end to the clockwise direction cw on the xy plane with a turn more than or equal to ¼ and less than ¾.

The via 42 penetrates through the dielectric layer 122 substantially in parallel with the z axis, and has a cross-sectional area different from the cross-sectional area of the via 41a. Also, the via 42 electrically connects the electrode 51 and the reference electrode 50 together. More specifically, the via 42 has a diameter larger than the diameter of the via 41a. That is, the "cross-sectional area" herein refers to a cross-sectional area when the via is viewed in a direction orthogonal to the laminating direction of the dielectric layers 121 to 124, and the diameter of the via is a specific example of this.

Note that when the diameter of a via penetrating through a dielectric layer is changed in that dielectric layer due to variations in manufacture or the like, the cross-sectional area of a location with the thickest diameter of that via may be taken as the cross-sectional area of that via. Also, the shape of the cross section of the via is not limited to a circle, and may be a polygon, such as a triangle or quadrangle. In this case, when the cross-sectional area of the via is changed in the dielectric layer, the largest cross-sectional area of that via may be taken as the cross-sectional area of that via.

When the upper surface of the dielectric layer 122 is viewed in plan view along the z-axis direction, the via 42 is positioned on an x-axis–side of the via 41a, and does not overlap the via 41a. An upper end portion and a lower end portion of the via 42 are connected to the second end of the electrode 51 and the reference electrode 50, respectively.

The via 44 penetrates through the dielectric layer 122 substantially in parallel with the z axis, and has a cross-sectional area different from the cross-sectional area of the via 43a. Also, the via 44 electrically connects the electrode 52 and the reference electrode 50 together. More specifically, the via 44 has a diameter larger than the diameter of the via 43a, for example, a diameter substantially equal to the diameter of the via 42. When the upper surface of the dielectric layer 122 is viewed in plan view along the z-axis direction, the via 44 is positioned on an x-axis+side of the via 43a, and does not overlap the via 43a. An upper end portion and a lower end portion of the via 44 are connected to the second end of the electrode 52 and the reference electrode 50, respectively.

A distance D2 between the via 42 and the via 44 is shorter than a distance D1 between the via 41a and the via 43a. More specifically, the distance D2 is, for example, the length of the shortest straight line connecting the center axis of the via 42 and the center axis of the via 44. The distance D1 is, for example, the length of the shortest straight line connecting the center axis of the via 41a and the center axis of the via 43a. According to this, compared with the distances between vias relatively close to the passive elements 60 to 62, distances between vias relatively far away from the passive elements 60 to 62 are short. Thus, when the filter device 11 is viewed in plan view along the z-axis direction, the vias 42 and 44 are easily formed inside a region where the passive elements 61, 62, and 63 are provided. Therefore, the space of the multilayer board 111 occupied by the vias 41a and 43a can be minimized, and thus the downsizing the filter device 11 can be easily achieved.

Figure 4:
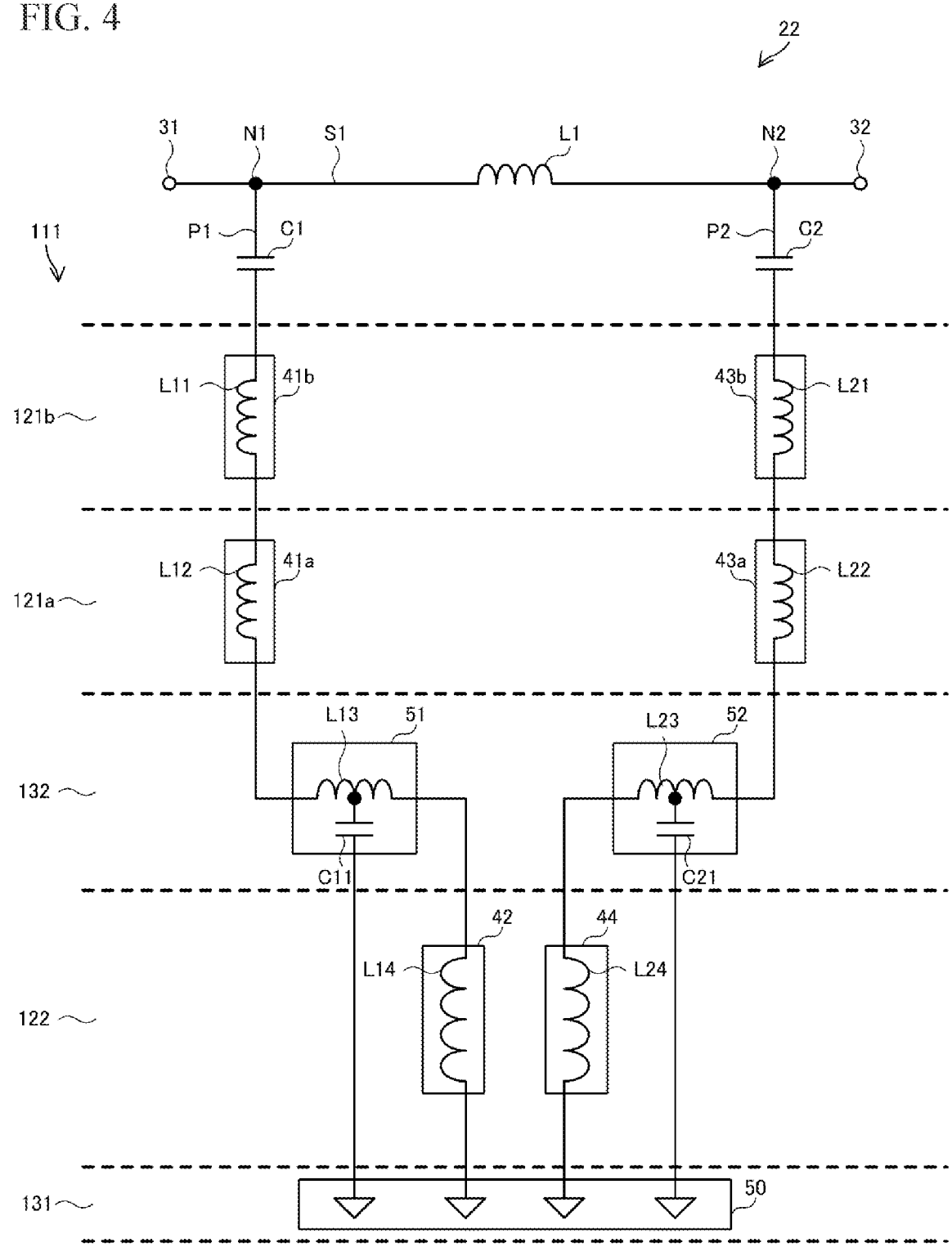
FIG. 4 is a circuit diagram of an equivalent circuit 22 of the filter device 11.

FIG. 4 is a circuit diagram of an equivalent circuit 22 of the filter device 11. As depicted in FIG. 4, vias and electrodes each function as an inductor. Also, the electrodes each function also as a capacitor.

More specifically, the vias 41b, 41a, and 42 included in the parallel wire P1 function as inductors L11, L12, and L14, respectively. The vias 43b, 43a, and 44 included in the parallel wire P2 function as inductors L21, L22, and L24, respectively.

The inductance of each of the vias 41b, 41a, 42, 43b, 43a, and 44 has a value in accordance with the shape of the via. Specifically, as the diameter of a via is larger, the inductance of that via is smaller. Also, as the length of the via, that is, the thickness of the dielectric layer where that via is provided, is larger, the inductance of that via is larger.

Therefore, by adjusting the diameter of a via and the thickness of the dielectric layer where that via is provided, the inductance of that via can be adjusted.

Also, the electrode 51 included in the parallel wire P1 functions as an inductor L13 and also forms a capacitor C11 between itself and the reference electrode 50. Similarly, the electrode 52 included in the parallel wire P2 functions as an inductor L23 and also forms a capacitor C21 between itself and the reference electrode 50.

The inductance of each of the electrodes 51 and 52 has a value in accordance with the number of windings, width, length, and so forth of that electrode. Also, the capacitance of the capacitor formed between the electrode 51 or 52 and the reference electrode 50 has a value in accordance with the distance between that electrode and the reference electrode 50, the area of that electrode, and so forth.

Therefore, by adjusting the shape and arrangement of the electrode 51, the inductance of the electrode 51 can be adjusted, and also the capacitance of the capacitor C11 formed between the electrode 51 and the reference electrode 50 can be adjusted. The same goes for the electrode 52 as for the electrode 51.

Thus, in the equivalent circuit 22, between the capacitor C1 and the ground, that is, the reference electrode 50, the inductors L11, L12, L13, and L14 are connected in series. The capacitor C11 is connected between the midpoint of the inductor L13 and the ground.

The inductors L21, L22, L23, and L24 are connected in series between the capacitor C2 and the ground. The capacitor C21 is connected between the midpoint of the inductor L23 and the ground.

Embodiment 2

A filter device 12 according to Embodiment 2 is described. In Embodiment 2 onward, description of matters in common with Embodiment 1 are omitted, and only different points are described. In particular, similar operations and effects by similar structures are not mentioned for each embodiment.

Figure 5:
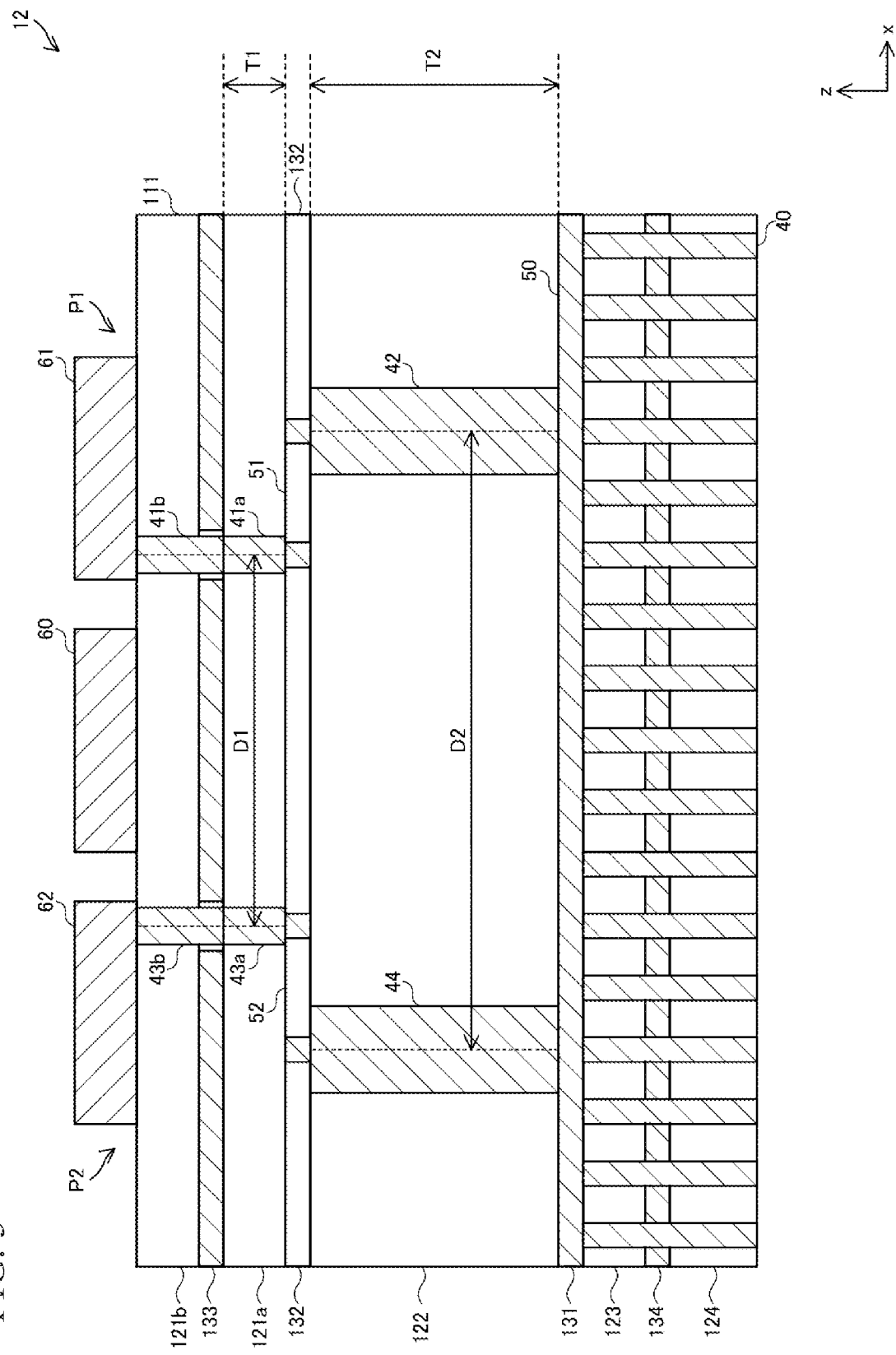
FIG. 5 is a drawing schematically depicting a cross section of a filter device 12 where the filter circuit 21 is formed, the cross section being parallel to a zx plane.

FIG. 5 is a drawing schematically depicting a cross section of the filter device 12 where the filter circuit 21 is formed, the cross section being parallel to a zx plane. As depicted in FIG. 5, the filter device 12 according to Embodiment 2 is different from the filter device 11 according to Embodiment 1 in that the distance D2 between the via 42 and the via 44 is longer than the distance D1 between the via 41a and the via 43a.

In the filter device 12, the diameter of the via 41a and the diameter of the via 43a are smaller than the diameter of the via 42 and the diameter of the via 44, respectively. The distance D1 between the center axis of the via 41a and the center axis of the via 43a is shorter than the distance D2 between the center axis of the via 42 and the center axis of the via 44.

Generally, when signals flow two vias provided in parallel, electromagnetic coupling between two vias is larger as the diameters of the vias are larger. As in the filter device 12, with the structure in which the distance D2 between the large-diameter vias 42 and 44 is longer than the distance D1 between the small-diameter vias 41a and 43a, electromagnetic coupling between the vias 42 and 44 is decreased, and deterioration in filter characteristics can be effectively suppressed.

Embodiment 3

Figure 6:
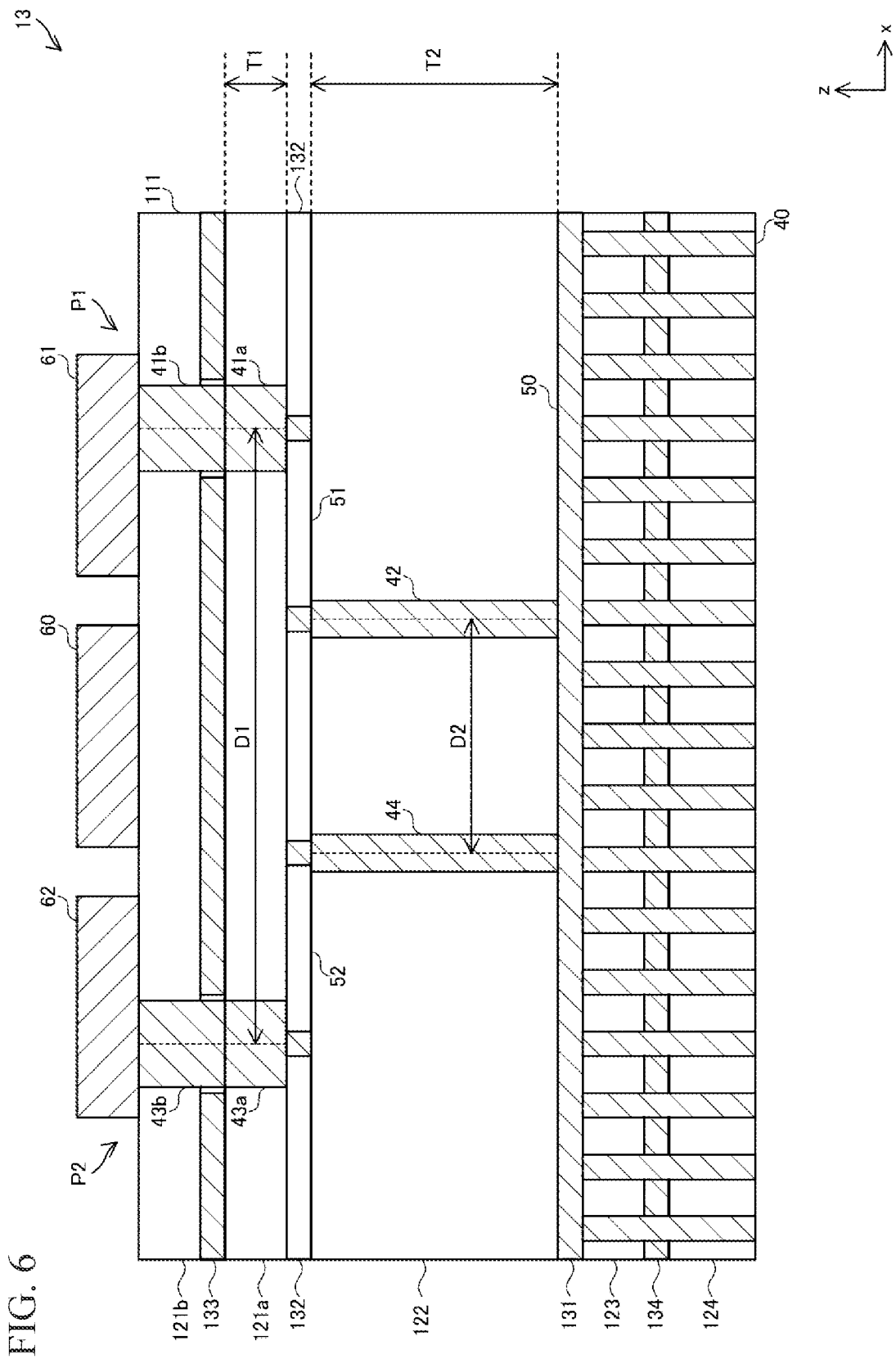
FIG. 6 is a drawing schematically depicting a cross section of a filter device 13 where the filter circuit 21 is formed, the cross section being parallel to a zx plane.

A filter device 13 according to Embodiment 3 is described. FIG. 6 is a drawing schematically depicting a cross section of the filter device 13 where the filter circuit 21 is formed, the cross section being parallel to a zx plane. As depicted in FIG. 6, the filter device 13 according to Embodiment 3 is different from the filter device 11 according to Embodiment 1 in that the diameter of the via 41a and the diameter of the via 43a are larger than the diameter of the via 42 and the diameter of the via 44, respectively.

In the filter device 13, the distance D1 between the center axis of the via 41a and the center axis of the via 43a is longer than the distance D2 between the center axis of the via 42 and the center axis of the via 44.

As in the filter device 13, with the structure in which the distance D1 between the large-diameter vias 41a and 43a is longer than the distance D2 between the small-diameter vias 42 and 44, electromagnetic coupling between the vias 41a and 43a is decreased, and deterioration in filter characteristics can be effectively suppressed.

Embodiment 4

Figure 7:
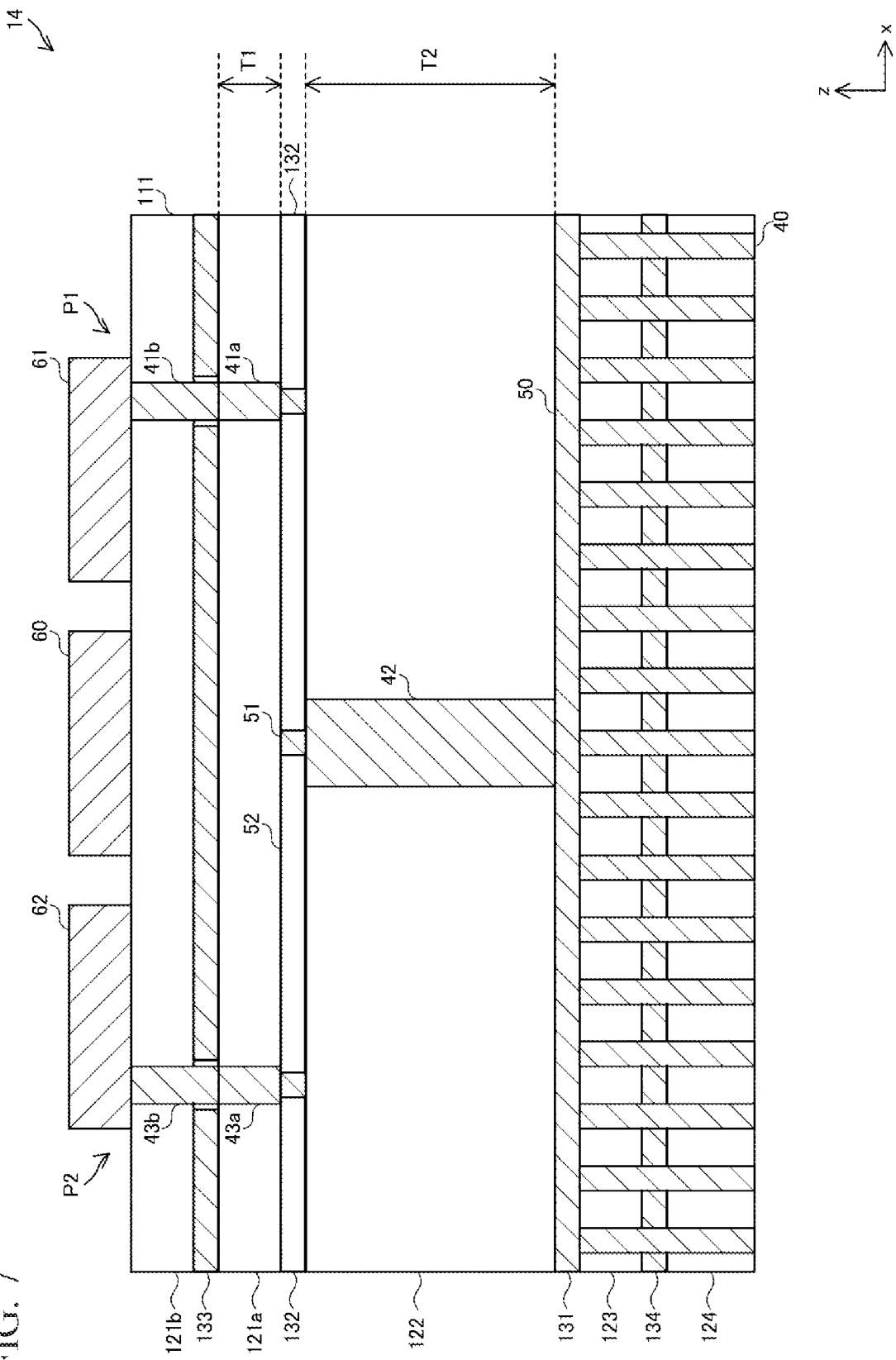
FIG. 7 is a drawing schematically depicting a cross section of a filter device 14 where the filter circuit 21 is formed, the cross section being parallel to a zx plane.

A filter device 14 according to Embodiment 4 is described. FIG. 7 is a drawing schematically depicting a cross section of the filter device 14 where the filter circuit 21 is formed, the cross section being parallel to a zx plane. As depicted in FIG. 7, the filter device 14 according to Embodiment 4 is different from the filter device 11 according to Embodiment 1 in which the via 42 and the via 44 are combined into one via 42.

Figure 8:
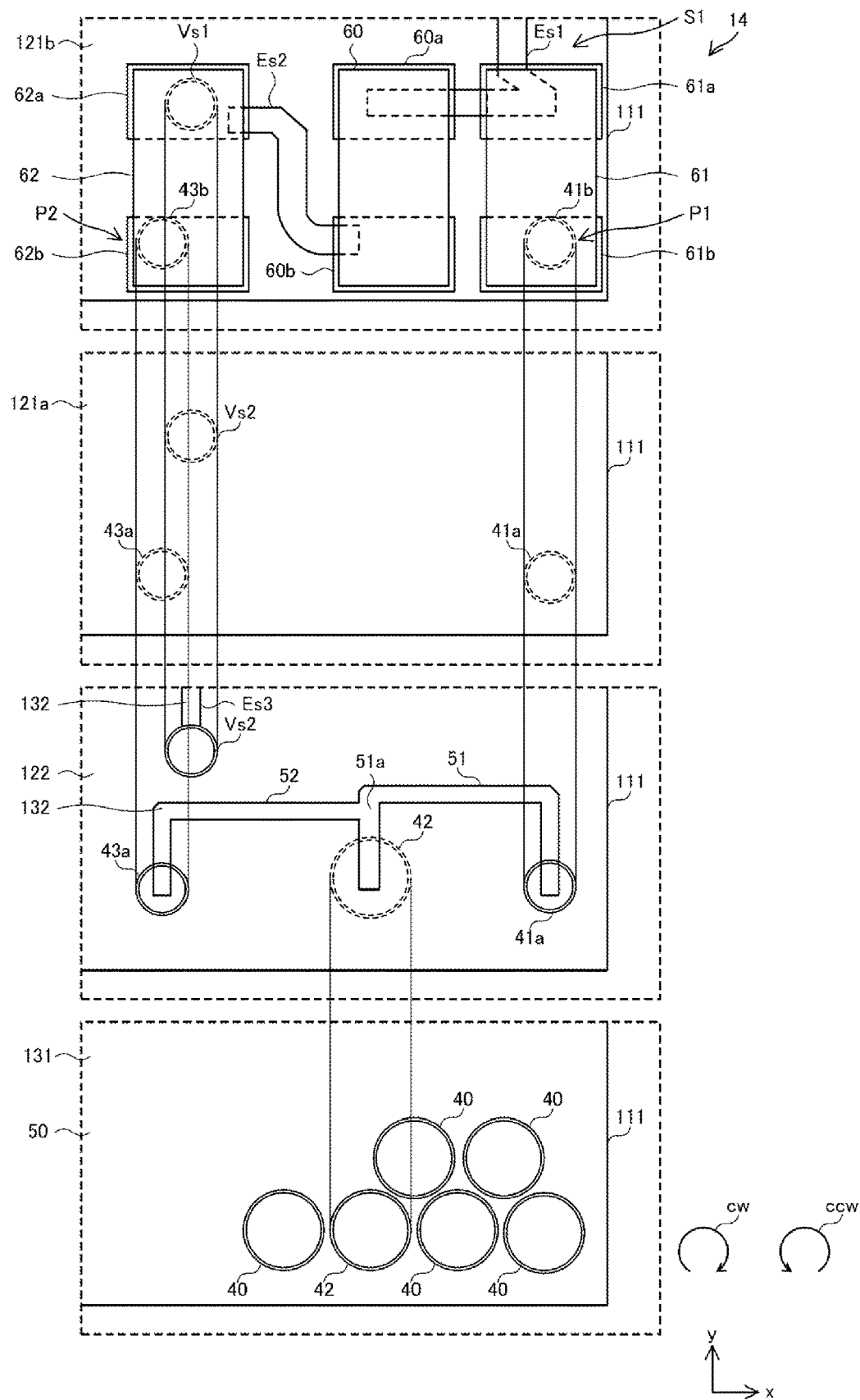
FIG. 8 is a drawing schematically depicting each cross section of the filter device 14 where the filter circuit 21 is formed, the cross section being parallel to an xy plane.

FIG. 8 is a drawing schematically depicting each cross section of the filter device 14 where the filter circuit 21 is formed, the cross section being parallel to an xy plane. Note that the way of viewing of FIG. 8 is similar to that of FIG. 3.

As depicted in FIG. 7 and FIG. 8, the parallel wire P1 includes the vias 41b, 41a, and 42 and the electrode 51. The parallel wire P2 does not include the via 44, compared with the parallel wire P2 depicted in FIG. 2. That is, the parallel wire P2 includes the vias 43b and 43a and the electrode 52. The parallel wire P2 is also a branch wire branched from the parallel wire P1. Specifically, the parallel wire P2 is a wire (branch wire) commonly connected to the parallel wire P1 on the wiring layer 132 and is not independent from the parallel wire P1.

The wiring layer 132 includes the electrode 51 (first electrode) and the electrode 52 (second electrode). The electrode 51 is extended from the via 41a, and electrically connects the via 41a and the via 42 together. The electrode 52 is extended from the via 43a, and electrically connects the via 43a and the via 42 together.

More specifically, the electrode 51 has a first end connected to a lower end portion of the via 41a and a second end positioned between the lower end portion of the via 41a and a lower end portion of the via 43a. The electrode 51 is wound from the first end to the second end to the counter-clockwise direction ccw on the xy plane with a turn more than or equal to ¼ and less than ¾.

The electrode 52 has a first end connected to the lower end portion of the via 43a and a second end positioned at the same position as the second end of the electrode 51. The electrode 52 is wound from the first end to the second end to the clockwise direction cw on the xy plane with a turn more than or equal to ¼ and less than ¾. Note that a portion between a connecting portion 51a between the electrodes 51 and 52 and the second end of the electrode 51 is shared by the electrodes 51 and 52.

The via 42 has a diameter larger than the diameter of the via 41a and larger than the diameter of the via 43a. When the upper surface of the dielectric layer 122 is viewed in plan view along the z-axis direction, the via 42 is positioned between the via 41a and the via 43a, and overlaps neither the via 41a nor 43a. An upper end portion of the via 42 is connected to the second end of the electrode 51 and the second end of the electrode 52. A lower end portion of the via 42 is connected to the reference electrode 50.

Figure 9:
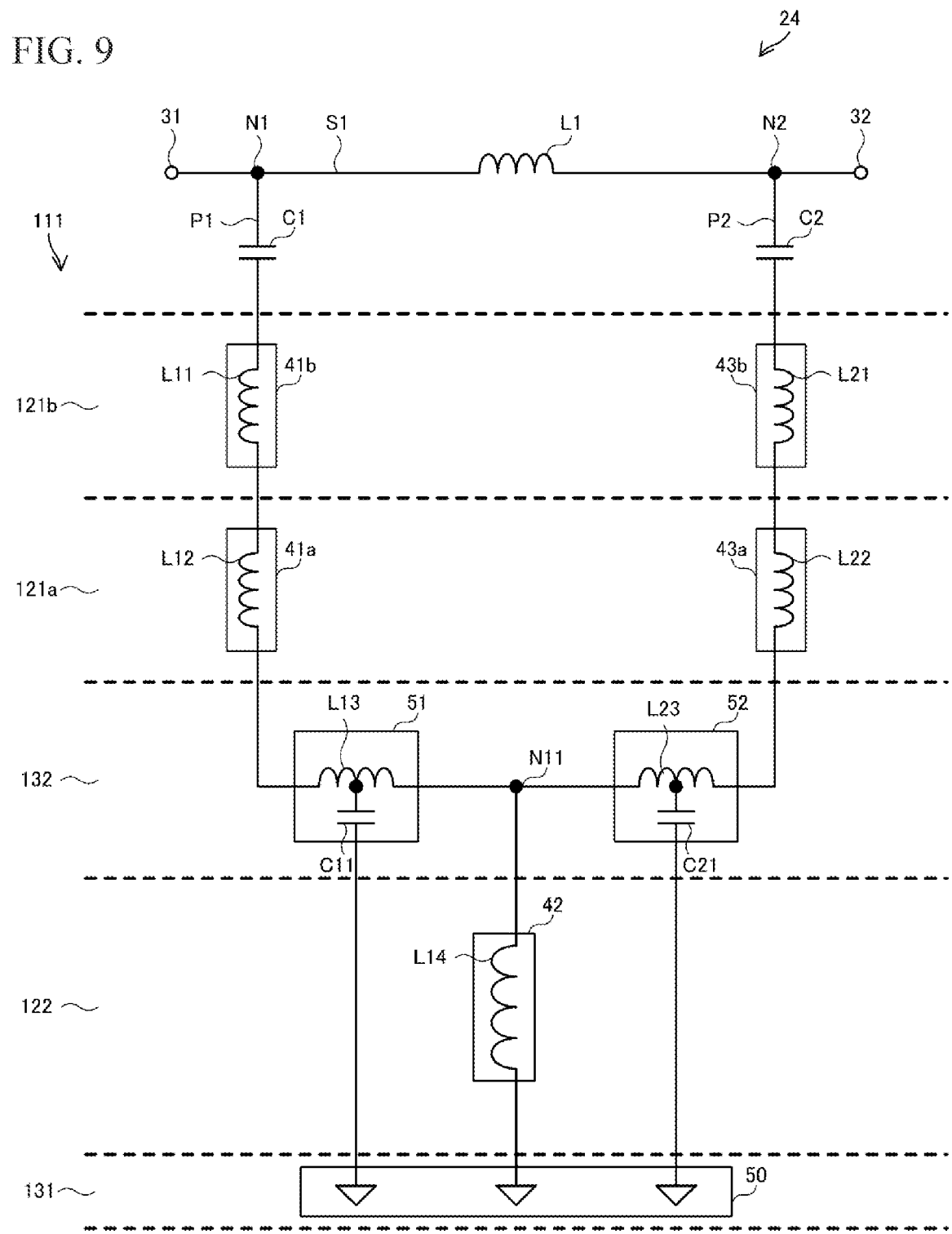
FIG. 9 is a circuit diagram of an equivalent circuit 24 of the filter device 14.

FIG. 9 is a circuit diagram of an equivalent circuit 24 of the filter device 14. As depicted in FIG. 9, in the equivalent circuit 24, between the capacitor C1 and the ground, the inductors L11, L12, L13, and L14 are connected in series. The capacitor C11 is connected between the midpoint of the inductor L13 and the inductor L13 and the ground.

Between the capacitor C2 and a node N11 positioned between the inductors L13 and L14, the inductors L21, L22, and L23, are connected in series. The capacitor C21 is connected between the midpoint of the inductor L23 and the ground.

Embodiment 5

Figure 10:
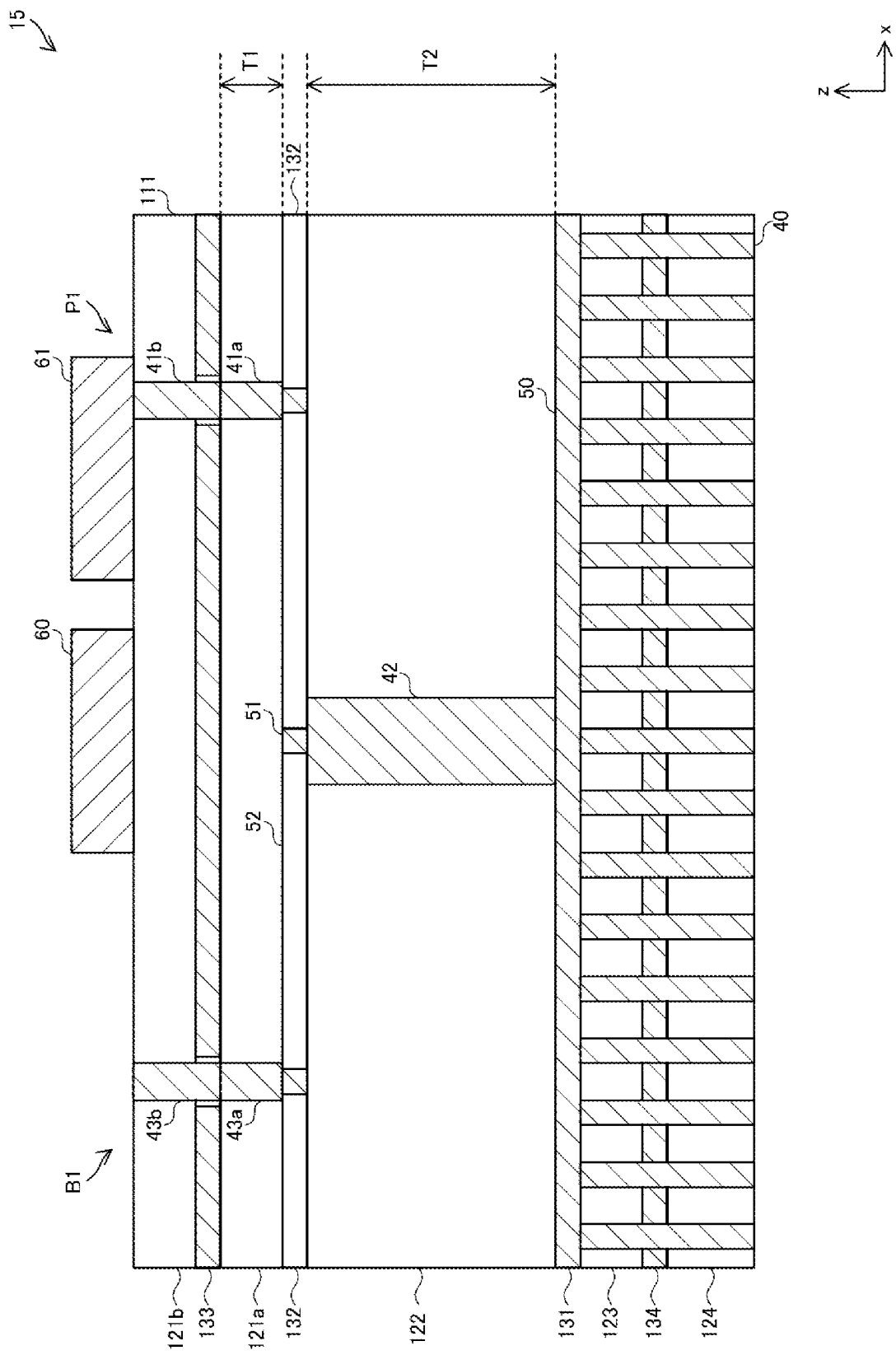
FIG. 10 is a drawing schematically depicting a cross section of a filter device 15 where an L-shaped filter circuit is formed, the cross section being parallel to a zx plane.

A filter device 15 according to Embodiment 5 is described. FIG. 10 is a drawing schematically depicting a cross section of the filter device 15 where an L-shaped filter circuit is formed, the cross section being parallel to a zx plane. As depicted in FIG. 10, the filter device 15 according to Embodiment 5 is different from the filter device 14 according to Embodiment 4 in that the parallel passive element 62 is not provided.

As depicted in FIG. 10, the parallel wire P1 is similar to the parallel wire P1 depicted in FIG. 7. A branch wire B1 includes vias 43b and 43a and the electrode 52. The vias 43b and 43a and the electrode 52 depicted in FIG. 10 are similar to the vias 43b and 43a and the electrode 52 depicted in FIG. 7. Note that in the branch wire B1, an upper end portion of the via 43b is open.

Figure 11:
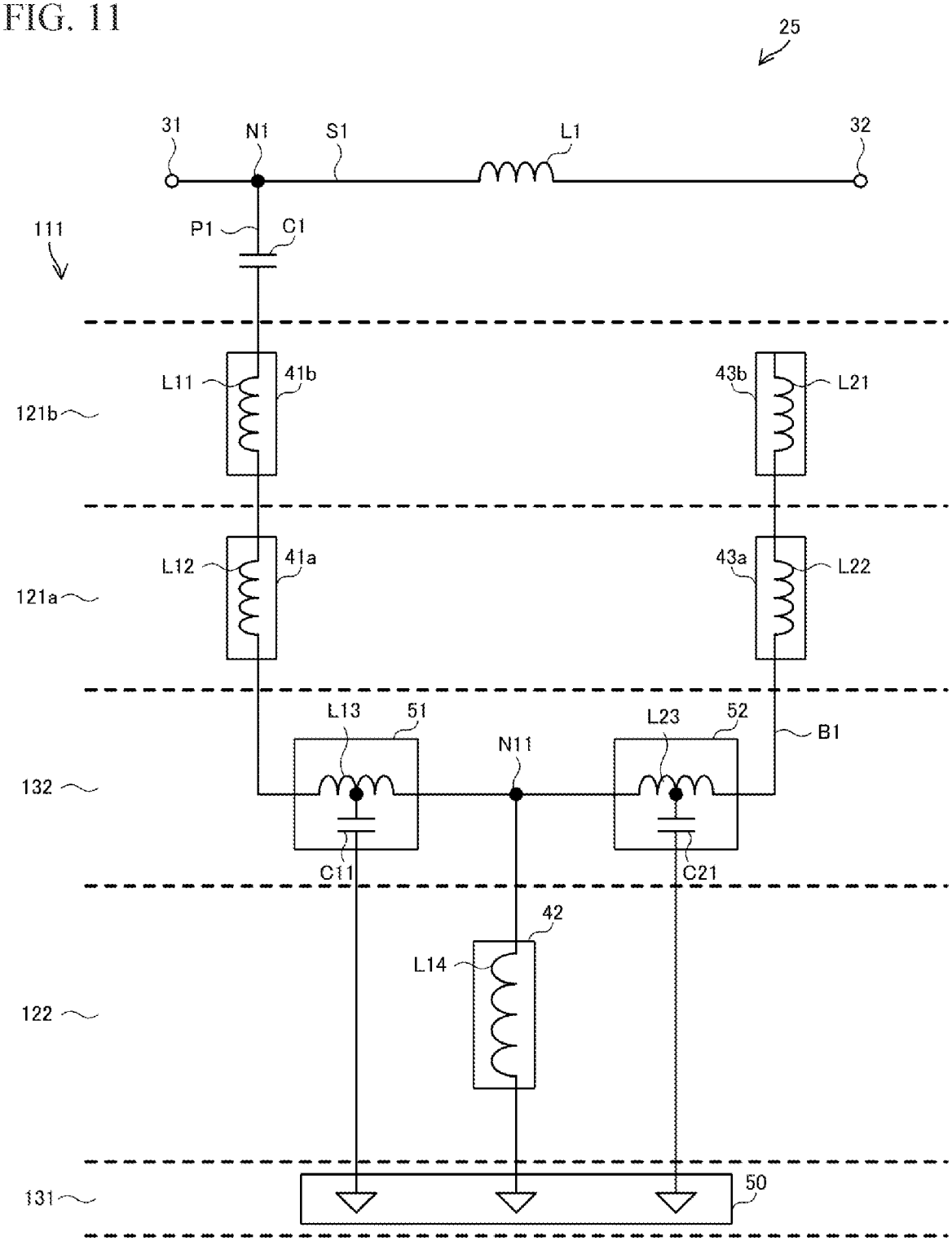
FIG. 11 is a circuit diagram of an equivalent circuit 25 of the filter device 15.

FIG. 11 is a circuit diagram of an equivalent circuit 25 of the filter device 15. As depicted in FIG. 11, the equivalent circuit 25 is not provided with the capacitor C2, compared with the equivalent circuit 24 depicted in FIG. 9. Thus, the second end of the inductor L1 and the output terminal 32 and the inductor L21 are electrically insulated.

More specifically, in the equivalent circuit 25, between the capacitor C1 and the ground, the inductors L11, L12, L13, and L14 are connected in series. The capacitor C11 is connected between the midpoint of the inductor L13 and the ground.

The branch wire B1 is branched from the node N11 positioned between the inductor L13 and the inductor L14. In the branch wire B1, the inductor L23 has a first end connected to the node N11 and a second end. The inductor L21 has a first end connected to the second end of the inductor L23 through the inductor L22 and a second end as an open end. The capacitor C21 is connected between the midpoint of the inductor L23 and the ground.

In this manner, since the second end of the inductor L21 is an open end, the branch wire B1 functions as an open stub circuit.

Note in the filter devices 11 to 13 that while the structure has been described in which the parallel wires P1 and P2 are provided, this is not meant to be restrictive. The structure may be such that either one of the parallel wires P1 and P2 is provided. Even this structure can achieve the object of the present application.

Also, in the filter devices 11 to 14, while the structure has been described in which the parallel wire P1 is branched from a portion between the input terminal 31 and the first end of the inductor L1 and the parallel wire P2 is branched from a portion between the output terminal 32 and the second end of the inductor L1, this is not meant to be restrictive. The structure may be such that the parallel wires P1 and P2 may be branched from a portion between the input terminal 31 and the first end of the inductor L1 or the parallel wires P1 and P2 may be branched from a portion between the output terminal 32 and the second end of the inductor L1.

Furthermore, in the filter devices 11 to 15, while the structure has been described in which the dielectric layer 121b is provided between the dielectric layer 121a and the series passive element 60 and the parallel passive elements 61 and 62, this is not meant to be restrictive. The structure may be such that the dielectric layer 121b is not provided and the series passive element 60 and the parallel passive elements 61 and 62 are positioned on the upper surface of the dielectric layer 121a.

Still further, in the filter devices 11 to 15, while the structure has been described in which the wiring layer 132 is provided between the dielectric layer 121a and the dielectric layer 122, this is not meant to be restrictive. The structure may be such that one or a plurality of dielectric layers are provided between the dielectric layer 121a and the dielectric layer 122.

Still further, in the filter devices 11 to 15, while the structure has been described in which the reference electrode 50 is connected to the ground, this is not meant to be restrictive. The reference electrode 50 may be configured to, for example, be connected to a constant voltage source serving as a power source of a power amplifier.

Still further, in the filter devices 11 to 15, while the structure has been described in which the passive elements 60, 61, and 62 are each formed of an SMD, this is not meant to be restrictive. At least one of the passive elements 60, 61, and 62 may be formed of a wiring pattern provided on the multilayer board 111.

Still further, in the filter devices 11 to 14, while the structure has been described in which the electrodes 51 and 52 are wound, this is not meant to be restrictive. The electrodes 51 and 52 may be each configured to, for example, be not wound but have a linear shape.

Still further, in the filter device 12, while the structure has been described in which the diameter of the via 41a and the diameter of the via 43a are smaller than the diameter of the via 42 and the diameter of the via 44, respectively, this is not meant to be restrictive. The structure may be such that the diameter of the via 41a and the diameter of the via 43a are larger than the diameter of the via 42 and the diameter of the via 44, respectively.

Exemplary embodiments of the present disclosure have been described above. In the filter devices 11, 12, 13, 14, and 15, the multilayer board 111 includes the dielectric layer 121a, the wiring layer 131 including the reference electrode 50 to which a reference potential is supplied, and the dielectric layer 122 positioned between the dielectric layer 121a and the wiring layer 131 and having the thickness T2 different from the thickness T1 of the dielectric layer 121a. The series passive element 60 is provided on the series wire S1 electrically connecting the input terminal 31 and the output terminal 32 together. The parallel wire P1 electrically connects the series wire S1 and the reference electrode 50 together. The parallel passive element 61 is provided on the parallel wire P1. The parallel wire P1 includes the via 41a penetrating through the dielectric layer 121a and electrically connected to the parallel passive element 61 and the via 42 penetrating through the dielectric layer 122 and electrically connecting the via 41a and the reference electrode 50 together. The dielectric layer 121a is positioned between the parallel passive element 61 and the dielectric layer 122. The cross-sectional area of the via 41a and the cross-sectional area of the via 42 are different.

In this manner, with the structure in which the thickness T1 and the thickness T2 are different and the cross-sectional area of the via 41a and the cross-sectional area of the via 42 are different, the vias 41a and 42 can each have a different length and a different cross-sectional area. That is, the parasitic inductance of the via 41a and the parasitic inductance of the via 42 can be made different from each other. That is, in the multilayer board 111 formed with the thicknesses T1 and T2 and the cross-sectional area of the via 41a and the cross-sectional area of the via 42 appropriately designed, the parasitic inductance of the via 41a and the parasitic inductance of the via 42 can be used as a circuit element adjustable in the filter circuit 21. Thus, flexibility of adjustment of filter characteristics can be enhanced. With this, for example, the series passive element 60 and the parallel passive element 61 are closely arranged to reduce the size of the filter device and, even if signal power loss is increased or attenuation characteristics are deteriorated by electromagnetic coupling between these passive elements, the filter characteristics are appropriately adjusted, thereby allowing an increase in signal power loss and deterioration in attenuation characteristics to be suppressed. Therefore, it is possible to provide a filter device in which, with a reduction in size, deterioration in filter characteristics can be suppressed.

Also, in the filter devices 11, 12, 13, 14, and 15, the multilayer board 111 further includes the wiring layer 132 positioned opposite to the wiring layer 131 with reference to the dielectric layer 122. The parallel wire P1 further includes the electrode 51 extended from the via 41a on the wiring layer 132 and electrically connecting the via 41a and the via 42 or the parallel passive element 61 together.

With this structure, as a circuit element adjustable in the filter circuit 21, a capacitor having a parasitic capacitance between the electrode 51 extended from the via 41a and the reference electrode 50 can be further formed. With this, flexibility of adjustment of filter characteristics can be further enhanced. Thus, with a reduction in size, deterioration in filter characteristics can be effectively suppressed.

Also, in the filter devices 11, 12, 13, 14, and 15, the electrode 51 is wound on the wiring layer 132.

With this structure, as a circuit element adjustable in the filter circuit 21, the inductor L13 having a parasitic capacitance by the wound electrode 51 can be further formed. With this, flexibility of adjustment of filter characteristics can be further enhanced. Thus, with a reduction in size, deterioration in filter characteristics can be effectively suppressed.

Also, in the filter devices 11, 12, and 13, the parallel wire P2 electrically connects the series wire S1 and the reference electrode 50 together, and is independent from the parallel wire P1. The parallel passive element 62 is provided on the parallel wire P2. The parallel wire P2 includes the via 43a penetrating through the dielectric layer 121a and electrically connected to the parallel passive element 62 and the via 44 penetrating through the dielectric layer 122 and electrically connecting the via 43a and the reference electrode 50 together. The dielectric layer 121a is positioned between the parallel passive element 62 and the dielectric layer 122. The cross-sectional area of the via 43a and the cross-sectional area of the via 44 are different.

With this structure, in the multilayer board 111 formed with the thicknesses T1 and T2 and the cross-sectional area of the via 43a and the cross-sectional area of the via 44 appropriately designed, the parasitic inductance of the via 43a and the parasitic inductance of the via 44 can be used as a circuit element adjustable in the filter circuit 21. With this, flexibility of adjustment of filter characteristics can be further enhanced. Thus, with a reduction in size, deterioration in filter characteristics can be effectively suppressed.

Also, in the filter device 11, the distance D2 between the via 42 and the via 44 is shorter than the distance D1 between the via 41a and the via 43a.

With this structure, when the upper surface of the dielectric layer 121a is viewed in plan view along the z-axis direction, the vias 42 and 44 can be arranged between the via 41a and the via 43a. Thus, the filter device 11 can be formed as compact. Thus, in the multilayer board 111, more utilizable spaces can be allocated.

Also, as in the filter device 12, when the cross-sectional area of the via 41a and the cross-sectional area of the via 43a are smaller than the cross-sectional area of the via 42 and the cross-sectional area of the via 44, respectively, the distance D1 between the via 41a and the via 43a is shorter than the distance D2 between the via 42 and the via 44. Also, as in the filter device 13, when the cross-sectional area of the via 41a and the cross-sectional area of the via 43a are larger than the cross-sectional area of the via 42 and the cross-sectional area of the via 44, respectively, the distance D1 between the via 41*a* and the via 43*a* is longer than the distance D2 between the via 42 and the via 44.

Generally, when signals flow two vias provided in parallel, electromagnetic coupling between two vias is larger as the diameters of the vias are larger. As in the filter devices 12 and 13, with the structure in which the distance between large-diameter vias is longer than the distance between small-diameter vias, electromagnetic coupling between the large-diameter vias can be decreased. Thus, deterioration in filter characteristics can be effectively suppressed.

Also, in the filter device 15, the branch wire B1 is branched from the parallel wire P1. The branch wire B1 includes the via 43*a* penetrating through the dielectric layer 121*a*. The via 42 further electrically connects the via 43*a* and the reference electrode 50 together.

In this manner, the via 43*a* can function as an open stub circuit. Thus, flexibility of adjustment of filter characteristics such as attenuation and the frequency band of the filter can be further enhanced. With this, with a reduction in size, deterioration in filter characteristics can be effectively suppressed.

Also, in the filter device 14, the branch wire (parallel wire P2) is branched from the parallel wire P1. The branch wire (parallel wire P2) includes the via 43*a* penetrating through the dielectric layer 121*a*. The via 42 further electrically connects the via 43*a* and the reference electrode 50 together. The branch wire (parallel wire P2) electrically connects the series wire S1 and the parallel wire P1 together. The parallel passive element 62 is provided on the branch wire (parallel wire P2), and electrically connects the series wire S1 and the via 43*a* together. The dielectric layer 121*a* is positioned between the parallel passive element 62 and the dielectric layer 122. The cross-sectional area of the via 43*a* is different from the cross-sectional area of the via 42.

In this manner, with the structure in which the via 42 is shared on a path from the parallel passive element 61 to the reference electrode 50 and a path from the parallel passive element 62 to the reference electrode 50, signals to be transmitted to the respective paths can be intentionally made interfere with each other. With this, filter characteristics different from filter characteristics when each path is independent can be achieved, an example of which are broad frequency characteristics. With this, flexibility of adjustment of filter characteristics can be enhanced. Thus, with a reduction in size, deterioration in filter characteristics can be effectively suppressed.

Also, in the filter devices 11, 12, and 13, the multilayer board 111 further includes the wiring layer 132 positioned opposite to the wiring layer 131 with reference to the dielectric layer 122. The parallel wire P1 further includes the electrode 51 extended from the via 41*a* on the wiring layer 132 and electrically connecting the via 41*a* and the via 42 or the parallel passive element 61 together. The parallel wire P2 further includes the electrode 52 extended from the via 43*a* on the wiring layer 132 and electrically connecting the via 43*a* and the via 44 or the parallel passive element 62 together.

With this structure, as a circuit element adjustable in the filter circuit 21, a capacitor having a parasitic capacitance between the electrode 51 extended from the via 41*a* and the reference electrode 50 and a capacitor having a parasitic capacitance between the electrode 52 extended from the via 43*a* and the reference electrode 50 can be further formed. With this, flexibility of adjustment of filter characteristics can be further enhanced. Thus, for example, frequency characteristics having a peak in accordance with the self resonant frequency of each parasitic capacitance can be achieved. With this, with a reduction in size, deterioration in filter characteristics can be effectively suppressed.

Also, in the filter device 14, the multilayer board 111 further includes the wiring layer 132 positioned opposite to the wiring layer 131 with reference to the dielectric layer 122. The parallel wire P1 further includes the electrode 51 extended from the via 41*a* on the wiring layer 132 and electrically connecting the via 41*a* and the via 42 or the parallel passive element 61 together. The branch wire (parallel wire P2) further includes the electrode 52 extended from the via 43*a* and electrically connecting the via 43*a* and the via 42 or the parallel passive element 62 together.

With this structure, as a circuit element adjustable in the filter circuit 21, a capacitor having a parasitic capacitance between the electrode 51 extended from the via 41*a* and the reference electrode 50 and a capacitor having a parasitic capacitance between the electrode 52 extended from the via 43*a* and the reference electrode 50 can be further formed. With this, flexibility of adjustment of filter characteristics can be further enhanced. Thus, for example, broad frequency characteristics can be achieved. With this, with a reduction in size, deterioration in filter characteristics can be effectively suppressed.

Also, in the filter device 15, the multilayer board 111 further includes the wiring layer 132 positioned between the dielectric layer 121*a* and the dielectric layer 122. The parallel wire P1 further includes the electrode 51 extended from the via 41*a* on the wiring layer 132 and electrically connecting the via 41*a* and the via 42 together. The branch wire B1 further includes the electrode 52 extended from the via 43*a* and electrically connecting the via 43*a* and the via 42 together.

With this structure, as a circuit element adjustable in the filter circuit 21, a capacitor having a parasitic capacitance between the electrode 51 extended from the via 41*a* and the reference electrode 50 and a capacitor having a parasitic capacitance between the electrode 52 extended from the via 43*a* and the reference electrode 50 can be further formed. With this, flexibility of adjustment of filter characteristics can be further enhanced. With this, with a reduction in size, deterioration in filter characteristics can be effectively suppressed.

Also, in the filter devices 11, 12, 13, 14, and 15, each of the electrodes 51 and 52 is wound on the wiring layer 132.

With this structure, as a circuit element adjustable in the filter circuit 21, the inductors L13 and L24 having parasitic inductances by the wound electrodes 51 and 52, respectively, can be further formed. With this, flexibility of adjustment of filter characteristics can be further enhanced. Thus, with a reduction in size, deterioration in filter characteristics can be effectively suppressed.

Also, in the filter devices 11, 12, 13, 14, and 15, an orientation in which the electrode 51 is wound and an orientation in which the electrode 52 is wound are opposite.

In this manner, the orientation of a magnetic field occurring by a current flowing into a path from the parallel passive element 61 through the electrode 51 to the reference electrode 50 and the orientation of a magnetic field occurring by a current flowing into a path from the parallel passive element 62 through the electrode 52 to the reference electrode 50 can be made opposite. Thus, interference of signals to be transmitted to the respective paths can be suppressed. Thus, deterioration in filter characteristics can be effectively suppressed.

Note that each embodiment described above is to facilitate understanding of the present disclosure and is not to limit the present disclosure for interpretation. The present disclosure can be changed/improved without necessarily deviating from the gist of the disclosure, and also include its equivalents. That is, those obtained by a person skilled in the art making a design change as appropriate are also included in the scope of the present disclosure as long as those include the features of the present disclosure. For example, the elements included in each embodiment and their arrangement, materials, conditions, shapes, sizes, and so forth are not limited to those exemplarily described, and can be changed as appropriate. Also, each embodiment is merely an example and, needless to say, partial replacement or combination of the structures described in different embodiments can be made, and these are also included in the scope of the present disclosure as long as they include the features of the present disclosure.

What is claimed is:

1. A filter device comprising:
    a multilayer board comprising:
        a first dielectric layer,
        a first wiring layer comprising a reference electrode to which a reference potential is supplied, and
        a second dielectric layer between the first dielectric layer and the first wiring layer, and having a thickness different than a thickness of the first dielectric layer;
    a series passive circuit element on a series wire, the series wire electrically connecting a first terminal and a second terminal together;
    a first parallel wire electrically connecting the series wire and the reference electrode together; and
    a first parallel passive circuit element on the first parallel wire,
    wherein the first parallel wire comprises:
        a first via penetrating through the first dielectric layer and electrically connected to the first parallel passive circuit element, and
        a second via penetrating through the second dielectric layer and electrically connecting the first via and the reference electrode together,
    wherein the first dielectric layer is between the first parallel passive circuit element and the second dielectric layer, and
    wherein a cross-sectional area of the first via and a cross-sectional area of the second via are different.

2. The filter device according to claim 1, wherein
    the multilayer board further comprises a second wiring layer opposite to the first wiring layer with reference to the second dielectric layer, and
    the first parallel wire further comprises a first electrode extended from the first via on the second wiring layer and electrically connecting the first via and the second via or the first parallel passive circuit element together.

3. The filter device according to claim 2, wherein the first electrode is wound on the second wiring layer.

4. The filter device according to claim 1, further comprising:
    a second parallel wire electrically connecting the series wire and the reference electrode together, the second parallel wire being independent from the first parallel wire; and
    a second parallel passive circuit element on the second parallel wire,
    wherein the second parallel wire comprises:
        a third via penetrating through the first dielectric layer and electrically connected to the second parallel passive circuit element, and
        a fourth via penetrating through the second dielectric layer and electrically connecting the third via and the reference electrode together,
    wherein the first dielectric layer is between the second parallel passive circuit element and the second dielectric layer, and
    wherein a cross-sectional area of the third via and a cross-sectional area of the fourth via are different.

5. The filter device according to claim 4, wherein a distance between the second via and the fourth via is shorter than a distance between the first via and the third via.

6. The filter device according to claim 4,
    wherein the cross-sectional area of the first via and the cross-sectional area of the third via are less than the cross-sectional area of the second via and the cross-sectional area of the fourth via, respectively, and a distance between the first via and the third via is shorter than a distance between the second via and the fourth via, or
    wherein the cross-sectional area of the first via and the cross-sectional area of the third via are greater than the cross-sectional area of the second via and the cross-sectional area of the fourth via, respectively, and the distance between the first via and the third via is longer than the distance between the second via and the fourth via.

7. The filter device according to claim 1, further comprising:
    a branch wire branched from the first parallel wire, wherein:
    the branch wire comprises a third via penetrating through the first dielectric layer, and
    the second via further electrically connects the third via and the reference electrode together.

8. The filter device according to claim 7, wherein:
    the branch wire electrically connects the series wire and the first parallel wire together,
    the filter device further comprises a second parallel passive circuit element on the branch wire and electrically connecting the series wire and the third via together,
    the first dielectric layer is between the second parallel passive circuit element and the second dielectric layer, and
    a cross-sectional area of the third via is different than the cross-sectional area of the second via.

9. The filter device according to claim 4, wherein:
    the multilayer board further comprises a second wiring layer opposite to the first wiring layer with reference to the second dielectric layer,
    the first parallel wire further comprises a first electrode extended from the first via on the second wiring layer and electrically connecting the first via and the second via or the first parallel passive circuit element together, and
    the second parallel wire further comprises a second electrode extended from the third via on the second wiring layer, and electrically connecting the third via and the fourth via or the second parallel passive circuit element together.

10. The filter device according to claim 8, wherein:
    the multilayer board further comprises a second wiring layer opposite to the first wiring layer with reference to the second dielectric layer,
    the first parallel wire further comprises a first electrode extended from the first via on the second wiring layer and electrically connecting the first via and the second via or the first parallel passive circuit element together, and the branch wire further comprises a second electrode extended from the third via on the second wiring layer and electrically connecting the third via and the second via or the second parallel passive circuit element together.

11. The filter device according to claim 7, wherein:

the multilayer board further comprises a second wiring layer between the first dielectric layer and the second dielectric layer, the first parallel wire further comprises a first electrode extended from the first via on the second wiring layer and electrically connecting the first via and the second via together, and the branch wire further comprises a second electrode extended from the third via on the second wiring layer and electrically connecting the third via and the second via together.

12. The filter device according to claim 9, wherein each of the first electrode and the second electrode is wound on the second wiring layer.

13. The filter device according to claim 12, wherein an orientation in which the first electrode is wound and an orientation in which the second electrode is wound are opposite.

* * * * *